(12) United States Patent
Brcka et al.

(10) Patent No.: US 7,776,748 B2
(45) Date of Patent: Aug. 17, 2010

(54) SELECTIVE-REDEPOSITION STRUCTURES FOR CALIBRATING A PLASMA PROCESS

(75) Inventors: Jozef Brcka, Loudonville, NY (US); Rodney L. Robison, East Berne, NY (US); Takashi Horiuchi, Kai (JP)

(73) Assignee: Tokyo Electron Limited, Tokyo (JP)

( * ) Notice: Subject to any disclaimer, the term of this patent is extended or adjusted under 35 U.S.C. 154(b) by 992 days.

(21) Appl. No.: 11/536,902

(22) Filed: Sep. 29, 2006

(65) Prior Publication Data

US 2008/0081482 A1    Apr. 3, 2008

(51) Int. Cl.
*H01L 21/302* (2006.01)

(52) U.S. Cl. ............... 438/695; 438/698; 438/700; 438/702; 438/723; 216/37; 216/60; 216/67

(58) Field of Classification Search ........... 438/695, 438/698, 700, 702, 723; 216/37, 60, 67
See application file for complete search history.

(56) References Cited

U.S. PATENT DOCUMENTS

| | | | | |
|---|---|---|---|---|
| 5,578,161 | A | * | 11/1996 | Auda ................ 438/9 |
| 5,639,345 | A | * | 6/1997 | Huang et al. ........ 438/699 |
| 5,688,358 | A | | 11/1997 | Tanaka et al. |
| 5,986,874 | A | | 11/1999 | Ross et al. |
| 6,039,836 | A | | 3/2000 | Dhindsa et al. |
| 6,042,686 | A | | 3/2000 | Dible et al. |
| 6,080,287 | A | | 6/2000 | Drewery et al. |
| 6,132,564 | A | | 10/2000 | Licata |
| 6,197,165 | B1 | | 3/2001 | Drewery et al. |
| 6,267,839 | B1 | | 7/2001 | Shamouilian et al. |
| 6,287,435 | B1 | | 9/2001 | Drewery et al. |
| 6,431,112 | B1 | | 8/2002 | Sill et al. |
| 6,608,690 | B2 | | 8/2003 | Niu et al. |
| 6,689,249 | B2 | | 2/2004 | Ke et al. |
| 6,719,886 | B2 | | 4/2004 | Drewery et al. |
| 6,755,945 | B2 | | 6/2004 | Yasar et al. |
| 6,768,983 | B1 | | 7/2004 | Jakatdar et al. |
| 6,785,638 | B2 | | 8/2004 | Niu et al. |
| 6,839,145 | B2 | | 1/2005 | Niu et al. |
| 7,072,049 | B2 | | 7/2006 | Niu et al. |
| 2002/0004309 | A1 | | 1/2002 | Collins et al. |
| 2004/0017574 | A1 | | 1/2004 | Vuong et al. |

(Continued)

OTHER PUBLICATIONS

Kinoshita.S et al. Jpn.J.Appl.Phys. vol. 41, (2002), pp. 1974-1980.*
Tsuruoka. t et al. Appl.Surface Sci. vol. 169-170, (2001), pp. 193-197.*

(Continued)

*Primary Examiner*—Lan Vinh
*Assistant Examiner*—Maki A Angadi
(74) *Attorney, Agent, or Firm*—Wood, Herron & Evans, LLP

(57) ABSTRACT

Calibration wafers and methods for calibrating a plasma process performed in a plasma processing apparatus, such as an ionized physical vapor deposition apparatus. The calibration wafer includes one or more selective-redeposition structures for calibrating a plasma process. The selective-redeposition structures receive a controllable and/or measurable amount of redeposited material during the plasma process.

19 Claims, 9 Drawing Sheets

U.S. PATENT DOCUMENTS

2005/0103444 A1    5/2005    Brcka
2005/0103445 A1    5/2005    Brcka et al.

OTHER PUBLICATIONS

Jozef Brcka, Segmented Biased Peripheral Electrode in Plasma Processing Method and Apparatus, U.S. Appl. No. 11/196,557, filed Aug. 3, 2005.

Jozef Brcka et al., Selective-Redeposition Structures for Calibrating a Plasma Process, U.S. Appl. No. 11/536,758, filed Sep. 29, 2006.

U.S. Patent and Trademark Office, Notice of Allowance, in related U.S. Appl. No. 11/536,758, dated Apr. 1, 2010, 27 pp.

* cited by examiner

SELECTIVE-REDEPOSITION STRUCTURES FOR CALIBRATING A PLASMA PROCESS

FIELD OF THE INVENTION

This invention relates generally to the field of semiconductor fabrication and, more particularly, to methods for determining a redeposition rate during a plasma process.

BACKGROUND OF THE INVENTION

Ionized physical vapor deposition is a technique used to deposit films, typically of a metal or a metal compound, on semiconductor wafers during the fabrication of semiconductor devices. Ionized physical vapor deposition is advantageous for metallization of high aspect ratio vias and trenches extending into semiconductor wafers. In particular, ionized physical vapor deposition provides excellent sidewall and bottom coverage for vias and trenches.

In an ionized physical vapor deposition apparatus, a metal target is mounted inside a vacuum chamber and biased with a negative voltage relative to the grounded metal walls of the vacuum chamber. A sputtering gas, such as argon, is flowed into the vacuum chamber. The negative voltage on the target excites the sputtering gas proximate to the target into a plasma state and accelerates ions from the plasma to bombard an exposed surface of the target. The ion bombardment sputters metal atoms from the target that are ejected with a distribution of angular trajectories. A semiconductor wafer, or other substrate, is held in the vacuum chamber near the target. A relatively high-density plasma is generated in a region of the vacuum chamber between the target and the semiconductor wafer. The plasma ionizes a large proportion of the metal atoms ejected from the target, which are thermalized by collisions within the plasma. The semiconductor wafer is also negatively biased relative to the electrically grounded metal walls of the chamber, which accelerates the ionized sputtered target atoms from the plasma toward the semiconductor wafer. The target atoms impact the semiconductor wafer with more perpendicular trajectories than characteristic of non-ionized sputtering. The near-normal incidence angle greatly increases the amount of material deposited at the bottom of high aspect ratio vias and trenches.

Etching or sputtering of the metal film forming on the surface of the wafer, which occurs concurrently with the metal film's deposition, is an important component of the ionized physical vapor deposition process. Operating pressures of tens of mTorr are required in the vacuum chamber of the ionized physical vapor deposition apparatus to permit the etched atoms of the material to thermalize in the plasma. At low chamber pressures (e.g., <30 mTorr), metal etched from the surface of the semiconductor wafer has a relatively large thermalization length (e.g., 100 mm to 200 mm). At higher chamber pressures (e.g., above 30 mTorr), the thermalization length is considerably shorter (e.g., 5 mm to 100 mm). A portion of the sputtered metal will return to the wafer surface and be reincorporated into the forming metal film as redeposited material. The rate of redeposition is influenced by the chamber pressure. At low chamber pressures, redeposition is negligible in comparison to the etch rate because only a small fraction of the etched metal will return back to the surface as a result of the large thermalization length.

As the vacuum chamber pressure increases, the density of the various species in the plasma likewise increases. The mean-free-path of the metal atoms etched from the metal film becomes small in comparison to the dimensions of the vacuum chamber, so that randomization occurs due to collisions and gas scattering of sputter etched metal. As a result, the thermalization length for the etched metal atoms drops. At chamber pressures greater than 30 mTorr, redeposition of the etched metal has a significant impact on the etch rate of the metal film.

In particular, the thermalization length required for atoms sputtered from metal film at a kinetic energy of several electron volts to reach a kinetic energy on the order of 0.1 eV to 0.2 eV is on the order of 15 mm or less at these vacuum chamber pressures. Measured etch rates are influenced by the redeposited sputter etched metal in a manner that cannot be reliably ascertained. Consequently, because of the significance of the redeposition, the actual etch rate at higher chamber pressures cannot be accurately evaluated in an ionized physical vapor deposition apparatus using conventional calibration wafers.

Moreover, the amount of redeposition experienced by the substrate surface as the metal film is deposited may exhibit a significant radial dependence relative to the azimuthal centerline of the substrate. In other words, a region of the substrate near the substrate edge may experience a more reduced redeposition rate than a region of the substrate located near the substrate center. The radial dependence may change dramatically with a relatively minor change in the vacuum chamber pressure. As a result, the ability to measure the actual etch rate is not only impacted by the redeposition process but may also exhibit a dependence correlated with the position on the substrate surface. In an ionized physical vapor deposition apparatus, conventional calibration wafers are unable to evaluate this position dependent behavior of the actual etch rate.

There is thus a need for a calibration wafer and a method for determining a redeposition rate during a plasma process.

SUMMARY OF THE INVENTION

The invention provides a calibration wafer and method of determining a redeposition rate for a plasma process using the calibration wafer. The method comprises receiving a calibration wafer, wherein the calibration wafer comprises a plurality of patterned regions of selective-redeposition structures in a layer of material on a carrier substrate, and determining an initial thickness of the material at a bottom portion of a selective-redeposition structure and an initial thickness of the material in a flat field region between adjacent patterned regions of the selective-redeposition structures. The method further comprises performing the plasma process, wherein the calibration wafer is exposed to a plasma for an exposure time so as to etch the material from the bottom portion of the selective-redeposition structures and from the flat field region between adjacent patterned regions of the selective-redeposition structures, and determining a final thickness of the material at the bottom portion of the selective-redeposition structure and a final thickness of the material in the flat field region between adjacent patterns of the selective-redeposition structures. The method further comprises determining an actual etch rate ($R_{actual}$) of the material in one of the selective-redeposition structures, determining an apparent etch rate ($R_{apparent}$) of the material in the flat field region, and determining the redeposition rate ($R_{redeposition}$) from a difference between the actual etch rate ($R_{actual}$) and the apparent etch rate ($R_{apparent}$). The method further comprises comparing the redeposition rate, or the actual etch rate, or the apparent etch rate, or a combination thereof to a product requirement; and either stopping the determining of the redeposition rate process if the product requirement is met, or applying a corrective action if the product requirement is not met.

In another embodiment of the invention, a method is provided for fabricating a calibration wafer. In another embodiment, a system is provided for using a calibration wafer to measure a redeposition rate for a plasma process. In another embodiment, a computer readable medium is provided for using a calibration wafer to measure a redeposition rate for a plasma process.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention where.

DETAILED DESCRIPTION

Figure 1:
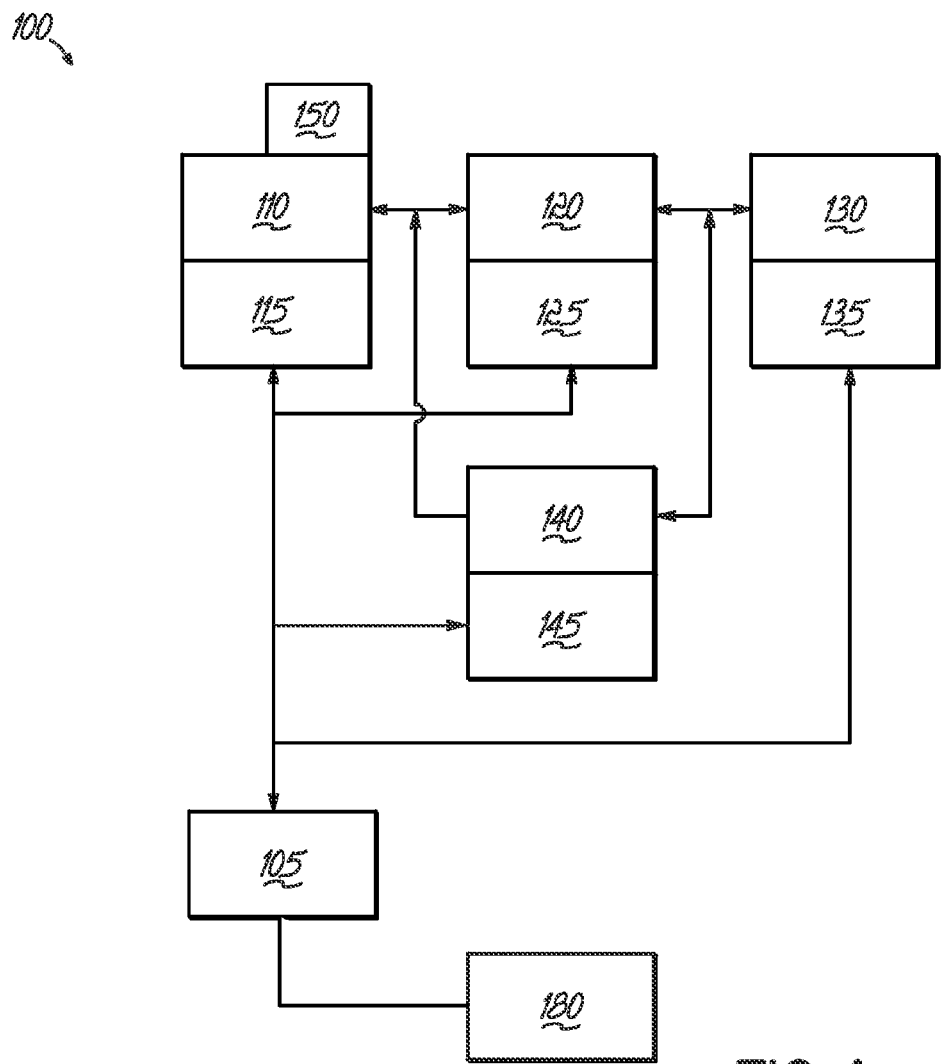
FIG. 1 shows an exemplary block diagram of a processing system in accordance with an embodiment of the invention.

With reference to FIG. 1, a processing system 100 comprises a lithography subsystem 110, a transfer subsystem 120, a processing subsystem 130, and a metrology subsystem 140. The lithography subsystem 110, the transfer subsystem 120, the processing subsystem 130, and the metrology subsystem 140 can be coupled to each other. The system 100 can include a system controller 105, the lithography subsystem 110 can include a controller 115, the transfer subsystem 120 can include a controller 125, the processing subsystem 130 can include a controller 135, and the metrology subsystem 140 can include a controller 145, and the controllers (105, 115, 125, 135, and 145) can be coupled to each other. In addition, a scanner 150 can be coupled to the lithography subsystem 110, or alternatively, the lithography system 110 may include a scanning system.

A manufacturing equipment system (MES) 180 can be coupled to the system controller 105. Alternatively other configurations may be used and other coupling techniques may be used.

One or more of the subsystems of the processing system 100 can comprise a control component, a GUI component, and/or a database component (not shown). In alternate embodiments, one or more additional subsystems may be required.

Some setup and/or configuration information can be obtained by one or more of the controllers (105, 115, 125, 135, and 145) from the MES 180. Factory level business rules can be used to establish a control hierarchy. Business rules can be used to specify the action taken for normal processing and the actions taken on error conditions. Also, factory level business rules can be used to determine when a process is paused and/or stopped, and what is done when a process is paused and/or stopped. In addition, factory level business rules can be used to determine when to change a process and how to change the process.

Business rules can be defined at a control strategy level, a control plan level or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 180 can be configured to monitor some system processes using data reported from by one or more of the controllers (105, 115, 125, 135, and 145). Factory level business rules can be used to determine which processes are monitored and which data is used. For example, the controllers (105, 115, 125, 135, and 145) can independently collect data, or the data collection process can be controlled to some degree by the MES 180. Also, factory level business rules can be used to determine how to manage the data when a process is changed, paused, and/or stopped. In addition, the MES 180 can provide run-time configuration information to one or more of the controllers (105, 115, 125, 135, and 145). Data can be exchanged using GEM SECS communications protocol.

In general, rules allow system and/or tool operation to change based on the dynamic state of the processing system 100 and/or the processing state of a product. Some setup and/or configuration information can be determined by the processing system subsystems when they are initially configured. In addition, rules can be used to establish a control hierarchy at the system/tool level. Rules can be used to determine when a process is paused and/or stopped, and what is done when a process is paused and/or stopped. In addition, rules can be used to determine what corrective actions are to be performed, such as when to change a process, how to change the process, and how to manage the data.

In FIG. 1, single subsystems are shown, but this is not required for the invention. The processing system 100 can comprise a different number of processing subsystems having any number of controllers associated with them in addition to other types of processing tools and modules. Processing subsystem 130 can include one or more etch modules, deposition modules, ALD modules, measurement modules, polishing modules, coating modules, developing modules, cleaning modules, and thermal treatment modules.

The system 100 can comprise an APC system that can interface with processing tools from Tokyo Electron Limited (TEL), such as a Unity Tool, a Telius Tool and/or a Trias Tool and their associated processing subsystems and process modules. In addition, the system 100 can comprise one or more run-to-run (R2R) controllers. For example, the processing system 100 can include a processing system from TEL, and one or more controllers such as a group level controller (i.e. an INGENIO™ GL controller from TEL), a tool level controller (i.e. an INGENIO™ controller from TEL), and a measurement analysis controller (i.e. a Profiler™ Application Server (PAS) from Timbre Technologies, Inc a TEL company). In addition, the IMM 160 can comprise an iODP system from Timbre Technologies, Inc.

One or more of the controllers (105, 115, 125, 135, and 145) can include GUI components (not shown) can provide easy to use interfaces that enable users to: view status; create/view/edit strategies, plans, errors, faults, databases, rules, recipes, modeling applications, simulation/spreadsheet applications, email messages, and diagnostics screens. As should be apparent to those skilled in the art, the GUI components need not provide interfaces for all functions, and may provide interfaces for any subset of these functions or others not listed here.

One or more of the controllers (105, 115, 125, 135, and 145) can include memory components (not shown) that can include one or more computer-readable storage media. Operational data, process data, library data, and/or computer executable code can be stored in memory components. Data collection plans can be used to control the data that is collected as well as when data is collected.

One or more of the controllers (105, 115, 125, 135, and 145) can include Fault Detection and Classification (FDC) applications, and they can exchange FDC information with each other and/or the MES 180. Rules can be used in Fault Detection and Classification (FDC) applications to determine how to respond to alarm conditions, error conditions, fault conditions, and/or warning conditions. In addition, the MES 180 can send command and/or override information to one or more of the controllers (105, 115, 125, 135, and 145). One or more FDC applications can be running at the same time and can send and/or receive information concerning an alarm/error/fault condition. For example, FDC information can be exchanged via an e-Diagnostics network, e-mail, or personal communication devices. For example, an alarm/error/fault condition can be established, and a message can be sent to pause the current process or to stop the current process when a limit is reached or exceeded, or when a product requirement is not met, or when a corrective action is required.

The subsystems (110, 120, 130, and 140) can control multiple processing applications and/or models that are executed at the same time and are subject to different sets of process constraints. For example, a controller can run in three different modes: simulation mode, test mode, and standard mode. A controller can operate in simulation mode in parallel with the actual process mode. In addition, FDC applications can be run in real-time and produce real-time accuracy improvement faults and/or errors. Furthermore, FDC applications can be run in a simulation mode and produce predicted accuracy improvement faults and/or errors.

The FDC system can detect faults, predict system performance, predict preventative maintenance schedules, decrease maintenance downtime, and extend the service life of consumable parts in the system. The interfaces to the FDC system can be web-enabled and can provide a real time FDC status display.

The subsystems (110, 120, 130, and 140) and/or the processing system 100 can take various actions in response to an alarm/fault, depending on the nature of the alarm/fault. The actions taken on the alarm/fault can be context-based, and the context can be specified by a rule, a system/process recipe, a module type, module identification number, load port number, cassette number, lot number, control job ID, process job ID, slot number and/or the type of data.

The controllers (105, 115, 125, 135, and 145) can exchange information with each other and/or with the MES 180. The information can include measurement data, process data, historical data, feed-forward data, and/or feedback data. Furthermore, the MES 180 can be used to provide measurement data, such as CD SEM information. Alternately, the CD SEM information can be provided using a system controller. CD SEM information can include adjustment factors and timestamp data that can be used to adjust for any offset between the system measurement tools and external measurement tools. For example, the external measurement tools may include a CD-Scanning Electron Microscopy (CDSEM) tool, a Transmission Electron Microscopy (TEM) tool, a focused ion beam (FIB) tool, or another optical metrology tool.

One or more control applications can be used to compute a predicted state for the wafer based on the input state, the process characteristics, and a process model. An etch rate model can be used along with a processing time to compute an etch depth, and a deposition rate model can be used along with a processing time to compute a deposition thickness. For example, models can include EM models, SPC charts, PLS models, PCA models, FDC models, and Multivariate Analysis (MVA) models. A control application can operate in a simulation mode, a test mode, and a standard mode.

The processing system 100 can provide wafer sampling and the wafer slot selection can be determined using a (PJ Create) function. The R2R control configuration can include, among other variables, feed forward control plan variables, feedback control plan variables, metrology calibration parameters, control limits, and SEMI Standard variable parameters. Metrology data reports can include wafer, site, structure, and composition data, among others, and the tool can report actual settings for the wafer The metrology subsystem 140 can include an Optical Digital Profiling (ODP) system (not shown). An ODP tool is available from Timbre Technologies Inc. (a TEL company) that provides a patented technique for measuring the profile of a structure in a semiconductor device. For example, ODP techniques can be used to obtain critical dimension (CD) information, structure profile information, or via profile information, and the wavelength ranges for an ODP system can range from 200 nm to 900 nm.

The metrology subsystem 140 can use polarizing reflectometry, spectroscopic ellipsometry, reflectometry, or other optical measurement techniques to measure true device profiles, accurate critical dimensions (CD), and multiple layer film thickness of a wafer. The process is executed in-line, which eliminates the need to break the wafer for performing the analyses. ODP techniques can be used with the existing thin film metrology tools for inline profile and CD measurement, and can be integrated with TEL processing tool and/or lithography system s to provide real-time process monitoring and control. An ODP™ solution has three key components: ODP™ Profiler™ Library comprises an application specific database of optical spectra and its corresponding semiconductor profiles, CDs, and film thicknesses. Profiler™ Application Server (PAS) comprises a computer server that connects with optical hardware and computer network. It handles the data communication, ODP library operation, measurement process, results generation, results analysis, and results output. The ODP™ Profiler™ Software includes the software installed on PAS to manage measurement recipe, ODP™ Profiler™ library, ODP™ Profiler™ data, ODP™ Profiler™ results search/match, ODP™ Profiler™ results calculation/analysis, data communication, and PAS interface to various metrology tools and computer network.

An exemplary optical metrology system is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

ODP techniques can be used to measure the presence and/or thickness of coatings on wafers and/or materials within features and/or structures of a patterned wafer. These techniques are taught in co-pending U.S. patent application Ser. No. 10/357,705, entitled "Model Optimization for Structures with Additional Materials" by Niu, et al., filed on Feb. 3, 2003, and ODP techniques covering the measurement of additional materials are taught in U.S. Pat. No. 6,608,690, entitled "Optical Profilometry of Additional-material Deviations in a Periodic Grating", filed on Dec. 4, 2001, and in U.S. Pat. No. 6,839,145, entitled "Optical Profilometry of Additional-material Deviations in a Periodic Grating", filed on May 5, 2003. The disclosure of each of these patent documents is hereby incorporated by reference herein in its entirety.

ODP techniques for creating a metrology model are taught in co-pending U.S. patent application Ser. No. 10/206,491, entitled "Model and Parameter Selection in Optical Metrology" by Voung, et al., filed on Jul. 25, 2002 and ODP techniques covering integrated metrology applications are taught in U.S. Pat. No. 6,785,638, entitled METHOD AND SYSTEM OF DYNAMIC LEARNING THROUGH A REGRESSION-BASED LIBRARY GENERATION PROCESS, filed on Aug. 6, 2001. The disclosure of each of these patent documents is hereby incorporated by reference herein in its entirety.

Recipes can be organized in a tree structure that can comprise recipe sets, classes, and recipes that can be displayed as objects. Recipes can include process recipe data, system recipe data, and IMM recipe data. IMM recipes can contain pattern recognition information, can be used to identify the chips to sample on each wafer, and can be used to determine which PAS recipe to use. PAS recipes can be used to determine which ODP library to use, and to define the measurement metrics to report, such as top CD, bottom CD, side wall angle (SWA), layer thicknesses, trench width, and goodness of fit (GOF).

Processing system 100 can include Advanced Process Control (APC) applications that can operate as control strategies, control plans, control models, and/or recipe managers to provide run-to-run (R2R) processing. For example, wafer level context matching at runtime allows for custom configuration by wafer (slot, waferID, lotID, etc.). In addition, feed forward and/or feedback control can be implemented by configuring control strategies, control plans, and control models. A Control Strategy can be written for each system process where feed forward and/or feedback control is implemented. When a strategy is protected, all of its child objects (plans and models) cannot be edited. When a system recipe executes, one or more of the Control Plans within the Control Strategy can be executed. Each control plan can be used to modify the recipe based on feed-forward and/or feedback information.

Control plans can cover multiple process steps within a process, and can be used to analyze the collected data, and establish error conditions. An analysis application can be executed when a context is matched. During the execution of an analysis application, one or more analysis plans can be executed. A plan can create an error when a data failure occurs, an execution problem occurs, or a control problem occurs. When an error occurs, the plan can generate an alarm message; the parent strategy status can be changed to a failed status; the plan status can be changed to a failed status; and one or more messages can be sent to the alarm log and the FDC system. When a feed forward plan or a feedback plan fails, one or more of the plans in the parent strategy may be terminated, and their status can be changed to a failed status. In one case, when a bad incoming wafer is detected, a control plan can detect and/or identify this as a faulty incoming wafer. In addition, when a feedback plan is enabled, the feedback plan can skip a wafer that has been identified to be defective and/or faulty by another plan. A data collection plan can reject the data at all the measurement sites for this wafer or reject the data because an accuracy improvement procedure fails to meet the required accuracy limits.

In one embodiment, feedback plan failure may not terminate the strategy or other plans, and a calibration procedure failure may also not terminate the strategy or other plans. Successful plans, strategies, and/or calibration procedures do not create any error/alarm messages. Pre-specified failure actions for strategy and/or plan errors can be stored in a database, and can be retrieved from the database when an error occurs. Failure actions can include use the nominal process recipe for this wafer or use a null process recipe for this wafer. A null recipe can be a control recipe that is used by a processing tool and/or processing system to allow a wafer to pass through and/or remain in a processing chamber without processing. For example, a null recipe can be used when a processing tool is paused or when a wafer does not require processing.

Process verification procedures and/or process model updates can be performed by running calibration/monitor wafers, varying the process settings and observing the results, then updating the process and/or models. For example, an update can take place every N processing hours by measuring the before and after characteristics of a calibration/monitor wafer. By changing the settings over time to check different operating regions one could validate the complete operating space over time, or run several calibration/monitor wafers at once with different recipe settings. The update procedure can take place at a tool level, at a system level, or at the factory level.

An updated calibration recipe and/or updated calibration model can be calculated at different times based on the wafer context and can be based on a product requirement. For example, feed-forward information, modeling information, and/or feedback information can be used to determine whether or not to change the current recipe before running the current wafer, before running the next wafer, or before running the next lot.

With reference to FIGS. 2-5 and in accordance with an embodiment of the invention, a calibration wafer 50 includes a film or layer 52 of a material and a plurality of patterned regions 54 distributed across the layer 52. Each of the patterned regions 54 includes a plurality of selective-redeposition structures 56 each having a bottom or base 57 and a sidewall 58 extending from the base 57 to a top surface 60 of the layer 52. Layer 52 is carried on a carrier substrate 62 that supplies mechanical robustness and facilitates handling, and may also define an electrically conductive ground plane. The carrier substrate 62 may be, for example, a round silicon substrate having a diameter of 200 mm, 300 mm, etc.

Figure 3:
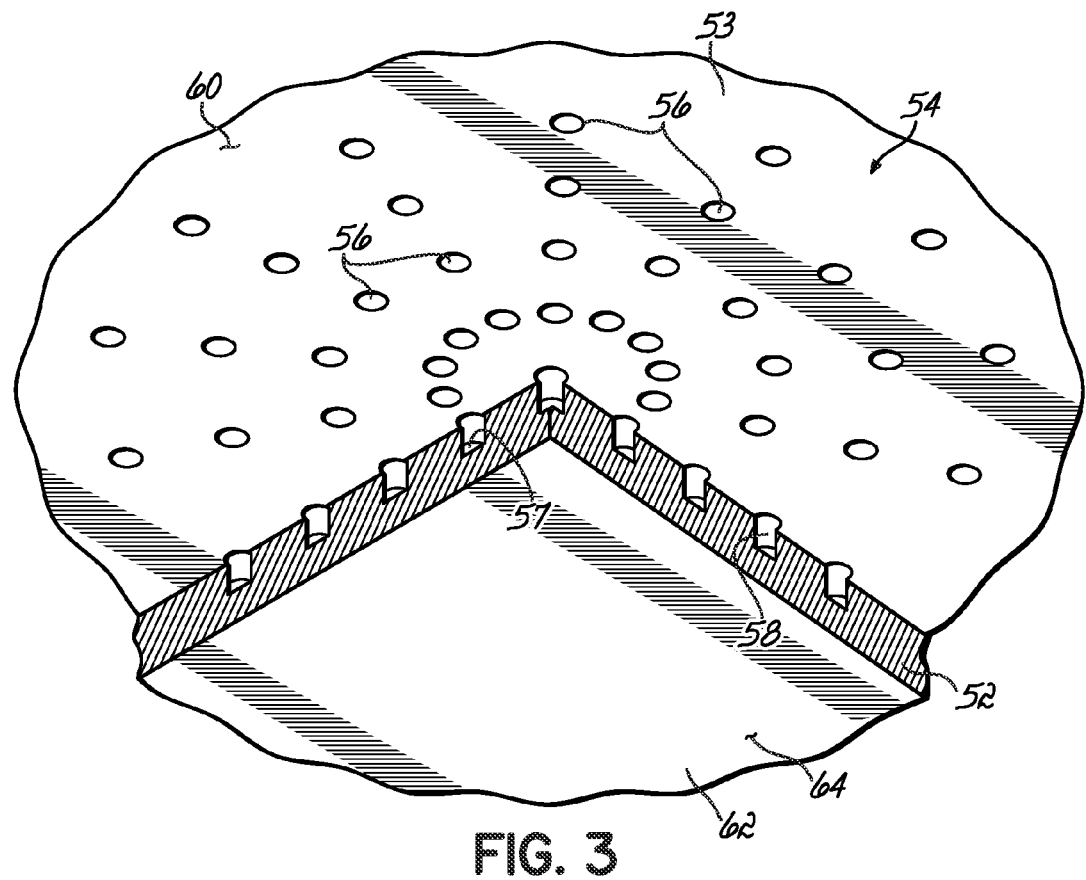
FIG. 3 is an enlarged view in partial cross-section of one patterned region of the selective-redeposition structures of the calibration wafer of FIG. 2.
Figure 4:
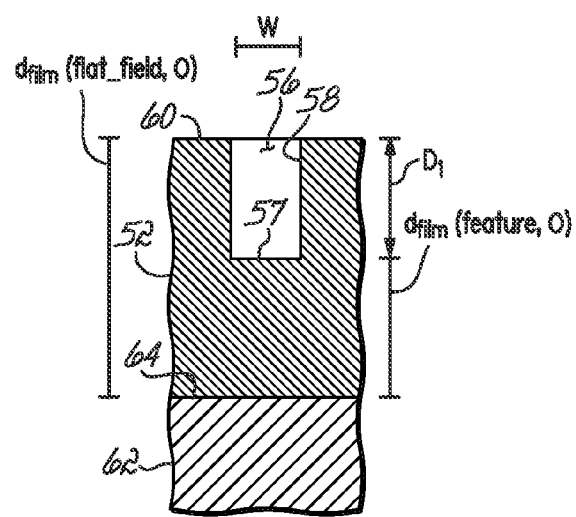
FIG. 4 is an enlarged cross-sectional view of one of the selective-redeposition structures in the patterned region of the calibration wafer shown in FIG. 3 before plasma exposure.

The depth, $D_1$, of each selective-redeposition structure 56 is measured as a distance from the top surface 60 of layer 52 to the base 57 of the selective-redeposition structure 56. The depth, $D_1$, is equal to the difference between $d_{film}$(flat_field, 0) and $d_{film}$(flat_field, 0). The width, W, of each selective-redeposition structure 56 is measured as the length of the longest line connecting two points on the periphery of the sidewall 58. Before plasma exposure, the selective-redeposition structures 56 may have a large aspect ratio (depth:width) that ranges from about 6:1 to about 10:1 and, in certain embodiments, an aspect ratio that is equal to about 8:1. The selective-redeposition structures 56 may be circular high aspect ratio vias, as shown in FIGS. 3 and 4, or may have different geometrical shapes, such as rectangular or square high aspect ratio troughs or trenches. As examples, the width of a circular selective-redeposition structure 56 is given by the diameter, and the width of a square selective-redeposition structure 56 may be given by the length of a diagonal line for non-circular geometries. A typical width, W, for each selective-redeposition structure 56 is less than about 100 nm, which implies that a typical depth, $D_1$, ranges from about 600 nm to about 1000 nm. A planar or flat field region 53 constituted by the material of layer 52 and having a substantially uniform thickness surrounds the selective-redeposition structures 56.

Layer 52 has an initial thickness given by $d_{film}$(structure, 0) inside each of the selective-redeposition structures 56, which is measured from the base 57 to a top surface 64 of the carrier substrate 62 defined along an interface between layer 52 and the carrier substrate 62, as best shown in FIG. 4. The initial thickness of layer 52 inside the selective-redeposition structures 56 is selected to be greater than a thickness of the material of layer 52 expected to be removed by the plasma process for the expected plasma exposure time. This ensures that layer 52 is not completely removed by etching from inside the selective-redeposition structures 56 during the test measurement. The initial thickness of layer 52 in the selective-redeposition structures 56 is measured using a metrology technique or test to establish the initial thickness before the calibration wafer 50 is exposed to the plasma inside the ionized physical vapor deposition apparatus 10. Layer 52 also has an initial thickness $d_{film}$(flat_field, 0) in the flat field region 53, which is measured as the distance between the top surfaces 60, 64.

When exposed to the plasma and bombarded by the constituent ions of the plasma drawn to the biased calibration wafer 50, the material of layer 52 will be incrementally eroded by sputtering (i.e., etching) in the flat field region 53. Similarly, the material of layer 52 at the base 57 of each selective-redeposition structure 56 is incrementally eroded by sputtering. The ions from the plasma promoting the sputtering have trajectories that reach the base 57 because of the high directionality of the anisotropic sputtering process. Candidate materials for layer 52 include, but are not limited to, copper, tantalum, aluminum, nickel, cobalt, ruthenium, gold, silver, or titanium, or a combination or two or more of these materials. The material of layer 52 has a sputtering yield that determines the removal rate under plasma exposure. As understood by a person having ordinary skill in the art, the sputtering yield of a material is a conventional measure of the efficiency of the sputtering process for removing atoms of the material from a layer. The sputtering yield for the material of layer 52 is substantially the same across the flat field region 53 and across the base 57 of each selective-redeposition structure 56.

The material layer 52 can be deposited using a chemical vapor deposition (CVD) process, plasma-enhanced chemical vapor deposition (PECVD) process, physical vapor deposition (PVD) process, ionized physical vapor deposition (IPVD) process, atomic layer deposition (ALD) process, or a plasma-enhanced atomic layer deposition (PEALD) process, or a combination thereof. Alternatively, the material layer 52 may include oxides, or nitrides, or a combination or two or more of these materials. The carrier substrate 62 may include a semiconductor material, a dielectric material, a metallic material, a planarization material, or an insulating material, or a combination of two or more of these materials.

In an alternate embodiment, the calibration wafer may also include one or more selective-redepostion sources as described in co-pending patent application Ser. No. 11/536,758 entitled "SELECTIVE-REDEPOSITION SOURCES FOR CALIBRATING A PLASMA PROCESS", which is hereby incorporated by reference herein in its entirety.

Atoms of sputtered material from the flat field region 53 of layer 52 lose kinetic energy by collisions with background gas atoms and, eventually, are thermalized at the kinetic energy of the background gas atoms. The thermalized energy is significantly less than the initial kinetic energy at the instant of sputtering from layer 52. A portion of these thermalized atoms diffuse back to the flat field region 53 and redeposit as a competitive process with sputtering. Hence, an etch rate measured for the material of layer 52 in the flat field region 53 is biased or altered by redeposition, which reduces the apparent etch rate relative to an actual etch rate of the material of layer 52 determined in the absence of redeposition. Moreover, the redeposited material is typically in a neutral state (i.e., not ionized). Neutral material is readily ionized near the plasma source (e.g., an ICP source), but not in vicinity of the wafer 50, which is distanced from the ICP source. As a result, predominately ions of the material reach the base 57 of the selective-redeposition structures 56 and redeposit. As a result, the flat field region 53 and the base 57 of the selective-redeposition structures 56 are exposed to the etching, but neutral atoms redeposit on only the flat field region 53. Because the high aspect ratio of the selective-redeposition structures 56 serve as a geometrically selective mask for redeposition of neutrals to a surface, such as the base 57, an actual etch rate is observed at the base 57 of the selective-redeposition structures 56 and an apparent etch rate is observed in the flat field region 53. The redeposition rate for the material of layer 52 is determined by a difference between the actual and apparent etch rates, and may be assessed as the radial dependence across the calibration wafer 50.

Figure 5:
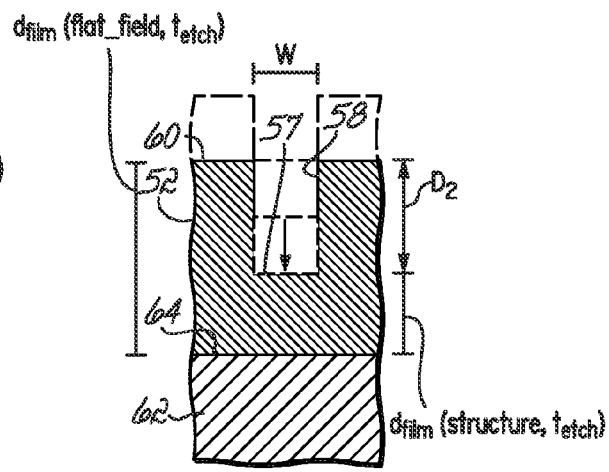
FIG. 5 is an enlarged cross-sectional view of one of the selective-redeposition structures in the patterned region of the calibration wafer shown in FIG. 3 following plasma exposure.

As mentioned above, the thermalized atoms from layer 52, which have a relatively low thermal kinetic energy, have a low probability of redepositing on base 57 because of the high aspect ratio of selective-redeposition structures 56. The etch rate measured for the material of layer 52 in the selective-redeposition structures 56 is not biased to a significant extent by redeposition and, hence, represents an actual etch rate of the material of layer 52. After a plasma exposure time given by $t_{etch}$ and as best shown in FIG. 5, layer 52 has a final thickness in the flat field region 53 given by $d_{film}$(flat_field, $t_{etch}$) and a final thickness inside the selective-redeposition structures 56 given by $d_{film}$(structure, $t_{etch}$). The final thickness of layer 52 in the flat field region 53 is measured as the distance between the recessed top surface 60 of layer 52 and the top surface 64 of the carrier substrate 62. The final thickness of layer 52 in each selective-redeposition structure 56 is measured as the distance between the recessed base 57 and top surface 64 of the carrier substrate 62. The post-etching depth, $D_2$, of the selective-redeposition sources 56 is given by the difference between $d_{film}$(flat_field, $t_{etch}$) and $d_{film}$(structure, $t_{etch}$). The post-etching width, W, of the selective-redeposition sources 56 may be substantially unchanged by the plasma exposure, especially if the etching process is highly anisotropic, or may change during the etching process.

The metrology test used to measure the post-etch depth (and pre-etch depth, if required) on both the field region 53 and the base 57 of the selective-redeposition structures 56 may comprise examining the calibration wafer 50 using an electron microscopy technique understood by a person having ordinary skill in the art. Specifically, a scanning electron microscope (SEM) may be used to measure the post-etch depth (and pre-etch depth, if required) on both the field region 53 and the base 57 of the selective-redeposition structures 56.

To prepare a sample for the representative SEM testing, the calibration wafer 50 is cleaved along a plane consistent with the centerline of the manufactured selective-redeposition structures 56. Care is taken to preserve the location of the sampled calibration pieces of calibration wafer 50. The manufacturing process for the selective-redeposition structures 56 should be accurate enough to provide initial structure depth or, alternatively, a control sample identical to calibration wafer 50 that may be cleaved to provide accurate initial structure depth. To perform the metrology test, the cleaved calibration wafer 50 is placed on a stage or substrate holder inside the vacuum chamber of the SEM, which is then evacuated ($<10^{-3}$ Pa). The cleaved calibration wafer 50 is scanned by the incident electron beam and secondary electrons emitted from the sample surface are collected and amplified to form a video signal. The focused spot on the specimen surface of wafer 50 allows shape and dimensional probing with a spatial resolution of several nm (typically about 2 nm). The operation principles and theory of the SEM are familiar to a person having ordinary skill in the art of metrology.

Figure 2:
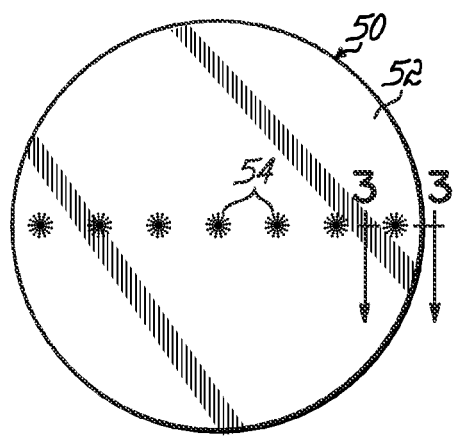
FIG. 2 is a diagrammatic view of a calibration wafer in accordance with an embodiment of the invention.

Although the invention is not so limited, the patterned regions 54 may be disposed along a diameter of the calibration wafer 50, as depicted in FIG. 2. This linear alignment crossing through the center of the calibration wafer 50 may facilitate a determination of the radial dependence of the actual etch rate for the first material. In an alternative embodiment, the selective-redeposition structures 56 may be distributed across the entire top surface 60 of the layer 52 without grouping or clustering into patterned regions 54. The majority of the top surface 60 comprises the flat field region 53.

The linearly arranged set of patterned regions 54 supplies a configuration for use in determining the azimuthal dependence or radial symmetry of the actual etch rate of the first material across the surface of the calibration wafer 50. Specifically, the metrology test is used to make a post-sputtering thickness measurement for one or more selective-redeposition structures 56 in each of the patterned regions 54 after plasma exposure and, then, an actual etch rate is calculated for each of the exposed 54. The actual etch rate in the patterned regions 54 is then analyzed as a function of the distance from the center of the calibration wafer 50. Because calibration wafer 50 is situated on the chuck 28 inside the vacuum chamber 12 and typically centered on the chuck 28, the actual etch rate may be correlated with different positions on the chuck 28.

Figure 6:
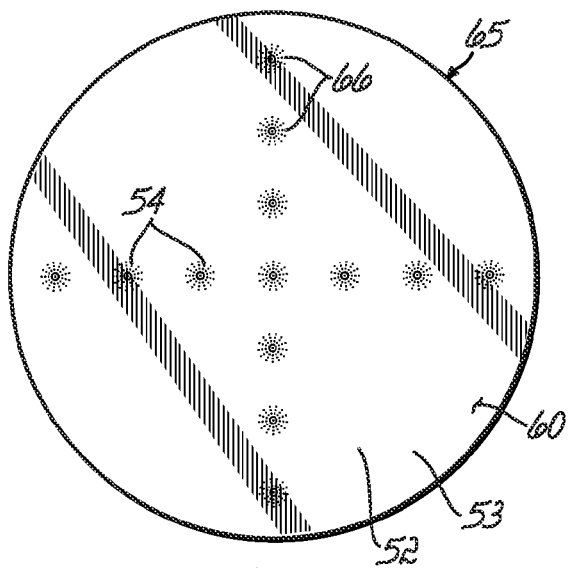
FIGS. 6-11 are diagrammatic views similar to FIG. 2 of different calibration wafers having constructions in accordance with alternative embodiments of the invention.

With reference to FIG. 6 in which like reference numerals refer to like features in FIGS. 2-5 and in accordance with an alternative embodiment of the invention, a calibration wafer 65 includes another set of linearly-aligned patterned regions 66 in addition to the linearly-aligned patterned regions 54 on calibration wafer 50. The second line of patterned regions 66 is aligned along a different diameter of calibration wafer 65 so that patterned regions 54, 66 are aligned along two different diameters of calibration wafer 65. Patterned regions 66 have selective-redeposition structures 56 with the same characteristics as patterned regions 54. The two linearly arranged sets of exposed patterned regions 58, 66 also supply a configuration for use in determining the azimuthal dependence or symmetry of the actual etch rate of the material of layer 52 across the surface of the calibration wafer 65 in a statistically averaged manner or relative to different selective-redeposition structures inside the vacuum chamber 12, such as the pumping port 15.

Figure 7:
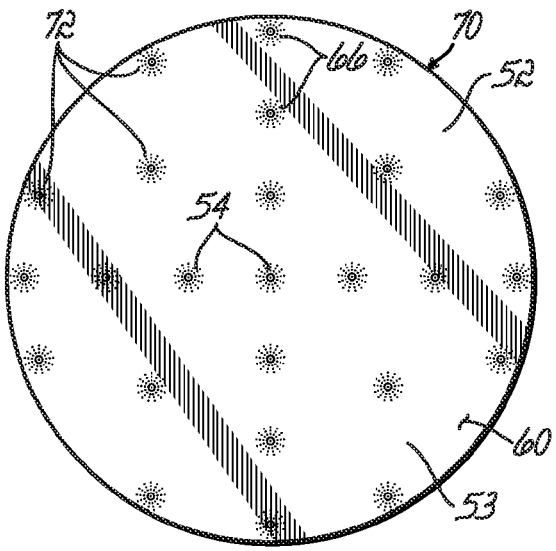

With reference to FIG. 7 in which like reference numerals refer to like features in FIGS. 2-6 and in accordance with an alternative embodiment of the invention, a calibration wafer 70 includes a plurality of patterned regions 72 in addition to the patterned regions 54, 66 that are linearly aligned across the corresponding diameters of calibration wafer 65 (FIG. 6). Increasing the number of patterned regions 54, 66, 72 improves the statistical accuracy in determining an average actual etch rate and also improves the surface mapping of the actual etch rate of the material of layer 52. Patterned regions 72 have selective-redeposition structures 56 with the same characteristics as selective-redeposition structures 56 in patterned regions 54, 66.

Figure 8:
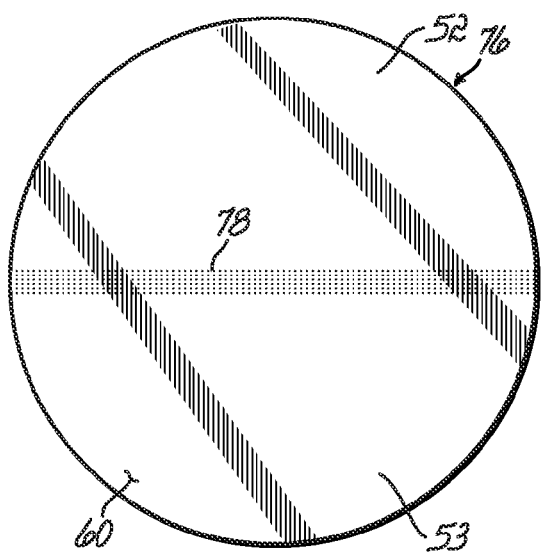

With reference to FIG. 8 in which like reference numerals refer to like features in FIGS. 2-7 and in accordance with an alternative embodiment of the invention, a calibration wafer 76 includes a patterned region 78 that consists of a continuous line extending across a diameter of the calibration wafer 76. The line length of the patterned region 78 may extend between two points on the periphery of the wafer 76 or, alternatively, may be circumscribed on at least one end by the periphery of the wafer 76. Patterned region 78 has selective-redeposition structures 56 with the same characteristics as the openings of patterned regions 54. Analysis of the actual etch rate for selective-redeposition structures 55 at various locations along the length of patterned region 78 may be used to evaluate a radial dependency of the etch rate relative to a centerline of the chuck 28 of the ionized physical vapor deposition apparatus 10 (FIG. 1).

Figure 9:
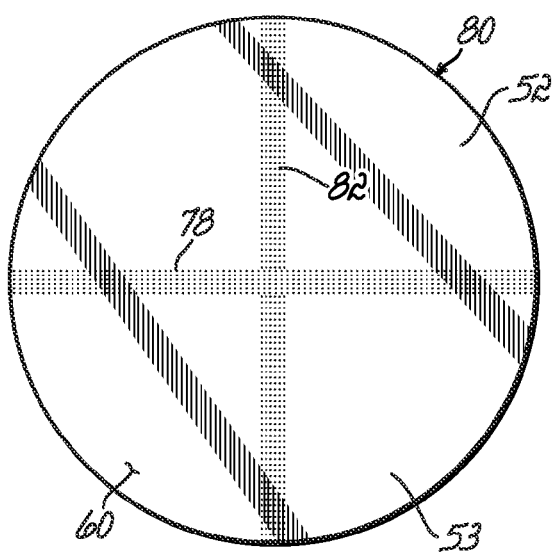

With reference to FIG. 9 in which like reference numerals refer to like features in FIGS. 2-8 and in accordance with an alternative embodiment of the invention, a calibration wafer 80 adds a patterned region 82 that consists of another continuous line to the configuration of calibration wafer 76 (FIG. 8). However, patterned region 82 extends across a different diameter of the calibration wafer 80 than patterned region 78 and crosses patterned region 78 near the center of the wafer 80. Patterned region 82 has selective-redeposition structures 56 with the same characteristics as patterned region 54. Analysis of the actual etch rate for selective-redeposition structures 56 at various locations along the lengths of patterned region 78, 82 may be used to evaluate a statistically-averaged radial dependency of the etch rate relative to a centerline of the chuck 28 of the ionized physical vapor deposition apparatus 10 (FIG. 1).

Figure 10:
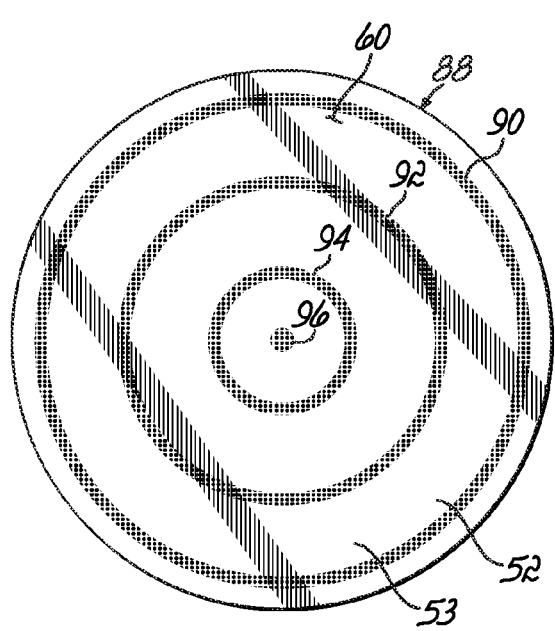

With reference to FIG. 10 in which like reference numerals refer to like features in FIGS. 2-9 and in accordance with an alternative embodiment of the invention, a calibration wafer 88 includes a plurality of circular patterned regions 90, 92, 94 that are concentrically arranged as rings of varying radius. The innermost circular patterned region 94 encircles a central patterned region 96 located at, or near, the wafer center. Patterned regions 90, 92, 94, 96 each have selective-redeposition structures 56 with the same characteristics as selective-redeposition structures 56 in patterned region 54.

Figure 11:
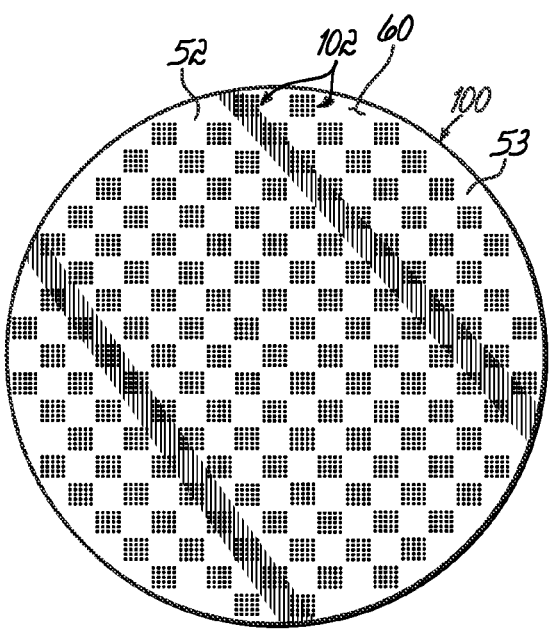

With reference to FIG. 11 in which like reference numerals refer to like features in FIGS. 2-10 and in accordance with an alternative embodiment of the invention, a calibration wafer 100 includes a plurality of patterned regions 102 that are arranged in a checkerboard pattern with adjacent patterned regions 102, which border at corners or vertices, which are distributed across the surface 60 of layer 52. The flat field region 53 is defined across the remainder of the surface area of the calibration wafer 100. Patterned regions 102 each have selective-redeposition structures 56 with the same characteristics as selective-redeposition structures 56 in patterned region 54.

Figure 12:
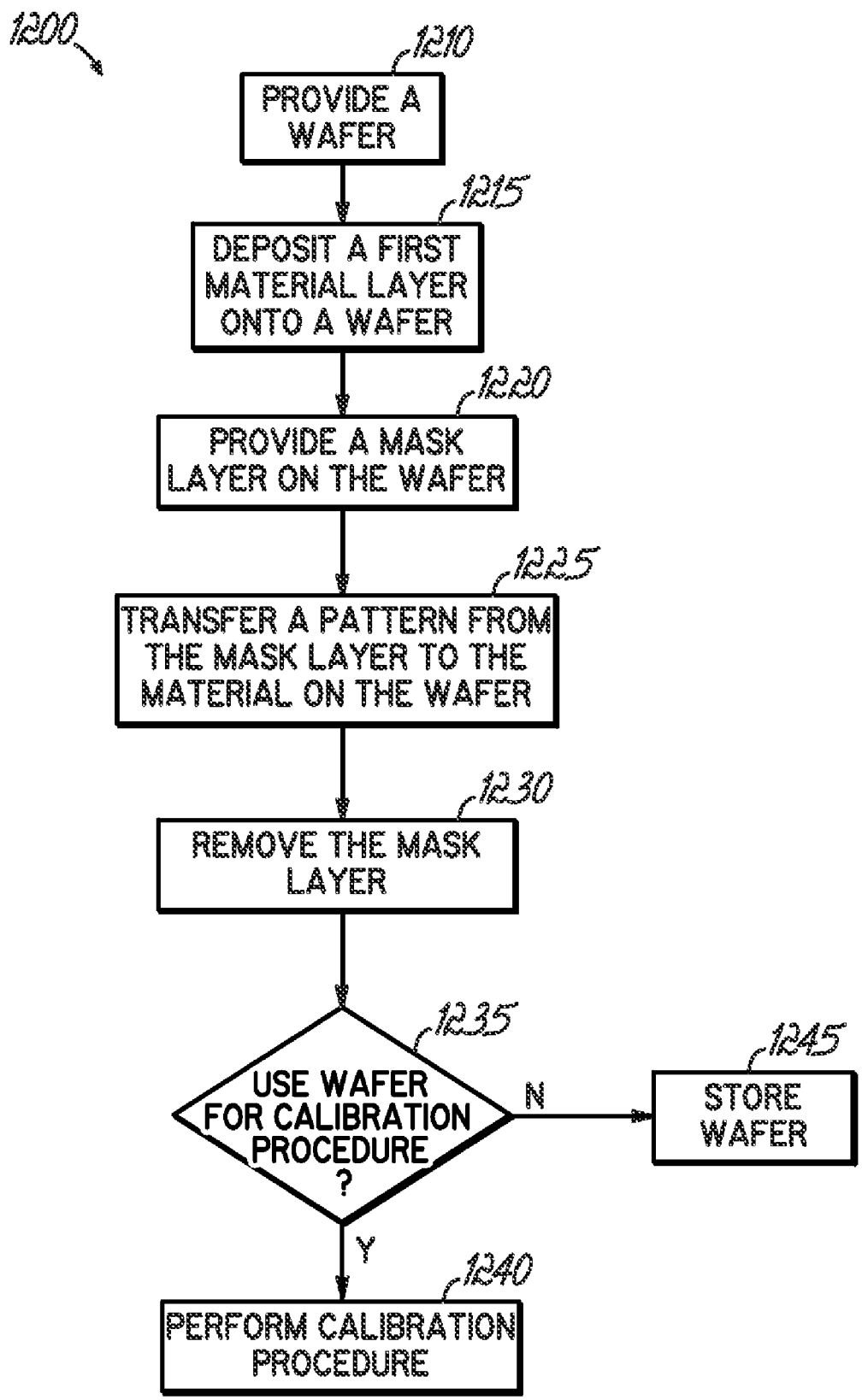
FIG. 12 shows a flow diagram of a process for fabricating a calibration wafer in accordance with embodiments of the invention.

With reference to FIG. 12, a representative procedure 1200 is shown for fabricating and using a calibration wafer of an embodiment of the invention. In task 1210, a wafer is provided to a processing system such as system 100 (FIG. 1). In one embodiment, the selective-redeposition structures 56 of calibration wafer 50 may be established in the material of layer 52 using a conventional lithography and etching process. Alternatively, other lithography procedures may be used. The representative procedure 1200 is understood to be applicable for fabricating the embodiments of the calibration wafer described herein.

In task 1215, the material layer 52 is deposited on the carrier substrate 62.

In task 1220, a mask layer is provided on the wafer. In one embodiment, a resist (not shown) can be deposited on the material layer 52. Alternatively, other materials such anti-reflective coating (ARC) material may also be used. The resist can be exposed to a pattern of radiation to impart a latent image characteristic of the arrangement of the selective-redeposition structures 56, and the exposed resist can be developed.

In task 1225, the pattern from the mask layer is transferred to the material layer 52. In one embodiment, the exposed pattern can be transferred from the resist to the material layer 52 using the patterned resist as an etch mask for a directional anisotropic dry etching process, such as a reactive-ion etching (RIE) process or a plasma etching process. Alternatively, a wet-etching process may be used. The etching process removes the constituent material layer 52 across areas exposed through the patterned resist. Alternatively, the etching process removes the constituent material layer 52 across unexposed areas. In one embodiment, the etching process can be timed and the resist pattern is chosen to provide one of the targeted aspect ratios for the selective-redeposition structures 56. Alternatively, an end point detection process or an etch stop material may be used to stop the etching process.

In task 1230, the remaining resist is removed from the top surface by a dry-cleaning or wet-cleaning process.

In task 1235, a query is performed to determine if the wafer will be used to perform a calibration procedure. When the wafer is to be used to perform a calibration procedure, procedure 1200 can branch to 1240, and when a calibration procedure is not required, procedure 1200 can branch to 1245.

In task 1240, a calibration procedure is performed using the wafer. In task 1245, the wafer is stored for later use.

Figure 13:
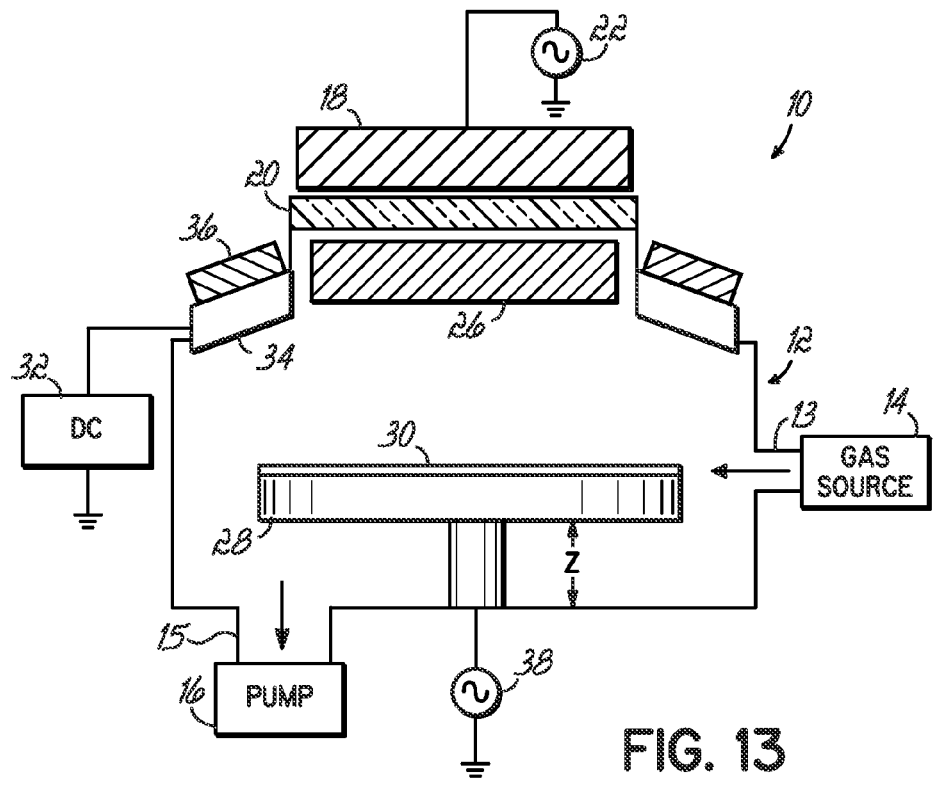
FIG. 13 illustrates a diagrammatic view of a processing subsystem in accordance with embodiments of the invention.

With reference to FIG. 13, an ionized physical vapor deposition (IPVD) apparatus 10 is a representative processing subsystem 110 (FIG. 1) in accordance with embodiment of the invention.

The ionized physical vapor deposition apparatus 10 includes a vacuum chamber 12 coupled by a gas introduction port 13 with a source 14 of a non-reactive sputtering gas, such as argon, and a pumping port 15 with a vacuum pump 16 that continuously evacuates gases from the vacuum chamber 12 to provide a suitable sub-atmospheric pressure constituted predominately by a partial pressure of the sputtering gas. The pressure inside the vacuum chamber 12 is adjusted to provide an appropriate ionized deposition range for conducting ionized physical vapor deposition. An antenna 18 is positioned outside of the vacuum chamber 12 on a non-vacuum side of a dielectric window 20. A radio-frequency (RF) generator 22 supplies high frequency electrical current to the antenna 18, which is coupled with the process gas inside the vacuum chamber 12 to generate a plasma. The dielectric window 20, which forms a portion of the vacuum chamber 12, separates the antenna 18 from the evacuated space inside the vacuum chamber 12. A deposition baffle 26, which is positioned inside of the vacuum chamber 12 in close proximity to the vacuum side of the dielectric window 20, serves to shield the dielectric window 20 from the plasma.

A temperature-controlled chuck 28 holds a semiconductor wafer 30 at a location inside the vacuum chamber 12 suitable to expose the wafer 30 to ions accelerated from the plasma. In addition, the temperature-controlled chuck 28 may be vertically translated before, during, and/or after a process is perform. A direct current (DC) power supply 32 is electrically coupled with a target 34 for DC biasing the target 34 relative to the grounded vacuum chamber 12. A permanent magnet pack 36 is located behind the target 34 to produce a magnetic tunnel over the target 34 sufficient for magnetron sputtering. The power levels of the DC power supply 32 and the RF generator 22 are selected as appropriate for ionized physical vapor deposition. A radio-frequency bias generator 38 is electrically coupled with the chuck 28 and supplies a net negative bias on the wafer 30 during deposition, which accelerates sputtered target atoms that are ionized from the plasma toward the semiconductor wafer 30.

Figure 14:
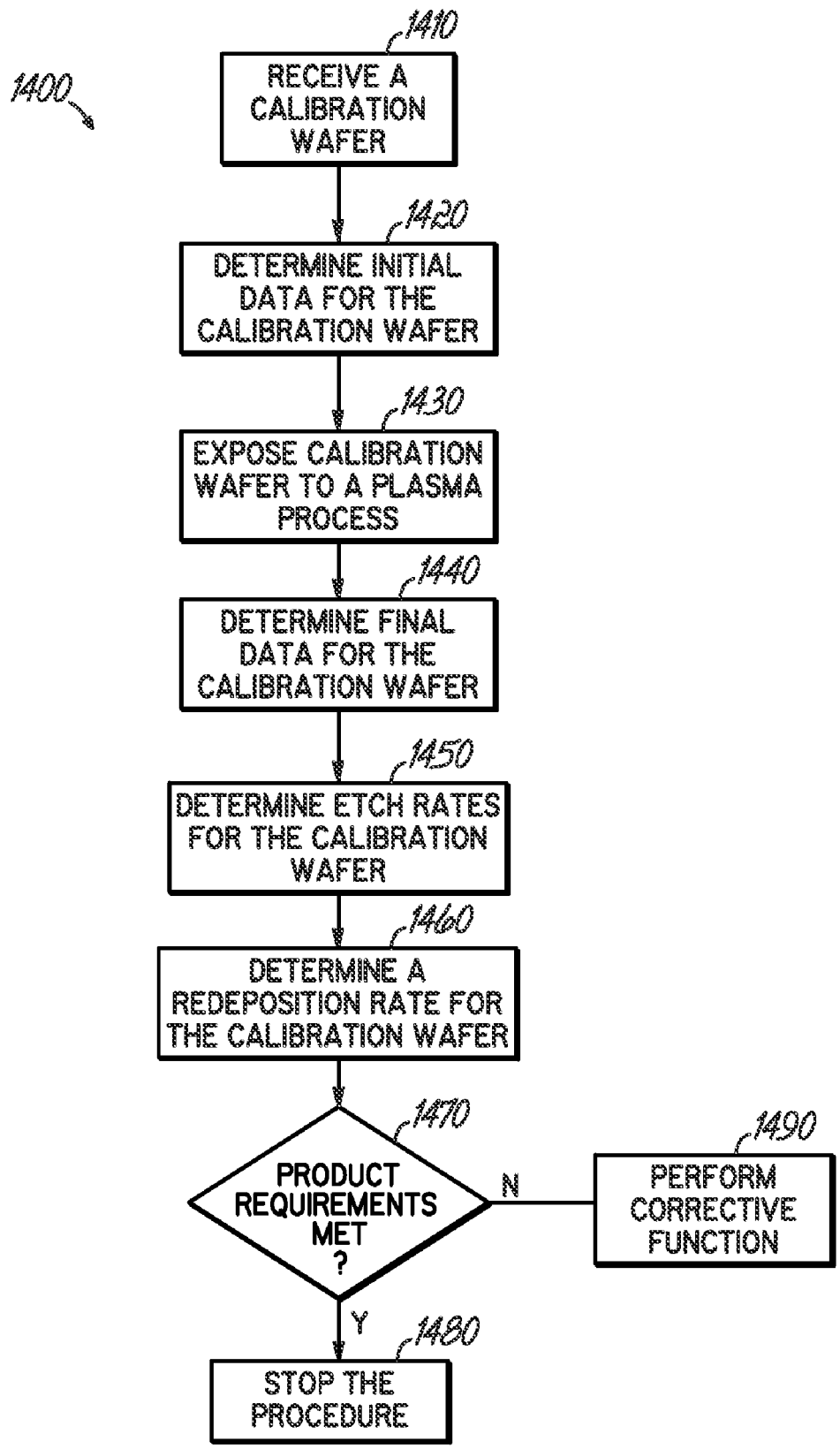
FIG. 14 illustrates a flow diagram for a method of measuring a wafer in accordance with embodiments of the invention.

With reference to FIG. 14, a representative procedure 1400 in accordance with an embodiment of the invention is illustrated for determining a redeposition rate for a plasma process using a calibration wafer of an embodiment of the invention. In addition, an actual etch rate and/or an apparent etch rate may be determined for a plasma process using the calibration wafer.

In task 1410, a calibration wafer, such as calibration wafer 50 (FIGS. 2-5), is received by a processing system, such as processing system 100 (FIG. 1). For example, a calibration wafer may be provided to a transfer subsystem 120 (FIG. 1). The calibration wafer can include a plurality of patterned regions of selective-redeposition structures that were created in a layer of material on a carrier substrate during a fabrication process. Each selective-redeposition structure can be determined using an area, a diameter, a depth, a width, a thickness, a sidewall angle, or an aspect ratio, or a combination thereof. In one embodiment, a distance between re-deposition structures is equal to or greater than a thermalization length determined using the characteristics of the plasma process. Alternatively, the distance may be less that the thermalization length. In addition, the total area of selective-redeposition structures is substantially less than a wafer area. In alternate embodiments, a calibration wafer that was manufactured at an earlier time may be provided to the processing system.

When creating the plurality of patterned regions of selective-redeposition structures on the calibration wafer, structures may be created that have aspect ratios that vary from approximately 6:1 to approximately 10:1 and a width of less than approximately 100 nanometers.

In task 1420, an initial set of data is determined for the wafer. An initial thickness of the material at a bottom portion of a selective-redeposition structure and an initial thickness of the material in a flat field region between adjacent patterned regions of the selective-redeposition structures may be determined. The initial thickness within a selective-redeposition structure may be determined using data created when the calibration wafer was fabricated. Alternatively, the initial thickness of an inside layer at a base of a selective-redeposition structure may be measured or calculated. In addition, an initial thickness of the material in a flat field region between adjacent patterned regions of the selective-redeposition structures can be determined using data created when the calibration wafer was fabricated. Alternatively, the initial thickness of the material in the field area adjacent a selective-redeposition structure may be measured or calculated.

In task 1430, the plasma process is performed, and the calibration wafer is exposed to a plasma for an exposure time so as to etch the material from the bottom portion of the selective-redeposition structures and from the flat field region between adjacent patterned regions of the selective-redeposition structures. The calibration wafer can be placed inside a vacuum chamber of a plasma processing apparatus, and plasma can be generated inside the vacuum chamber. Alternatively, a deposition process may be performed during the plasma exposure time, and a material may be deposited and/or sputtered in the base portion of the selective-redeposition structures and in the flat field region.

In task 1440, a final set of data is determined for the wafer. A final thickness of the material at the bottom portion of the selective-redeposition structure and a final thickness of the material in the flat field region between adjacent patterns of the selective-redeposition structures can be determined. The final thickness within a selective-redeposition structure can be determined using data generated when the plasma process was performed on the calibration wafer. Alternatively, the final thickness of an inside layer at a base of a selective-redeposition structure may be measured or calculated. In addition, the final thickness of the material in the flat field region can be determined using data generated when the plasma process was performed on the calibration wafer. Alternatively, the final thickness of the material in the flat field region may be measured or calculated.

In task 1450, the etching rates are determined. An actual etch rate ($R_{actual}$) of the material in each of the selective-redeposition structures can be determined from a quotient having a numerator equal to a difference between the initial and final thicknesses inside the selective-redeposition structures and a denominator equal to the plasma exposure time. This relationship may be expressed as:

$$R_{actual} = \frac{d(\text{structure}, t_{etch}) - d(\text{structure}, 0)}{t_{etch}}$$

where d(structure,0) is the initial thickness inside the selective-redeposition structure and d(structure, $t_{etch}$) is the final thickness inside the selective-redeposition structure.

In addition, an apparent etch rate ($R_{apparent}$) of the material outside of the selective-redeposition structures can be determined from a quotient having a numerator equal to a difference between the initial and final thicknesses outside the selective-redeposition structures and a denominator equal to the plasma exposure time. This relationship may be expressed as:

$$R_{apparent} = \frac{d(\text{flat\_field}, t_{etch}) - d(\text{flat\_field}, 0)}{t_{etch}}$$

where d(flat_field,0) is the initial thickness outside the selective-redeposition structure and d(flat_field, $t_{etch}$) is the final thickness outside the selective-redeposition structure.

In task 1460, the redeposition rate can be determined from a difference between the first actual etch rate ($R_{actual}$) and the first apparent etch rate ($R_{apparent}$), and this relationship can be expressed as:

$$R_{redeposition} = (R_{actual}) - (R_{apparent}).$$

In task 1470, a query can be performed to determine if the redeposition rate, or the actual etch rate, or the apparent etch rate, or a combination thereof is less than or equal to a product requirement. Procedure 1400 can branch to 1480 if the redeposition rate, or the actual etch rate, or the apparent etch rate, or a combination thereof is less than or equal to a product requirement, and procedure 1400 can branch to 1490 if the redeposition rate, or the actual etch rate, or the apparent etch rate, or a combination thereof is not less than or equal to a product requirement.

In task 1480, the determining of the redeposition rate process can be stopped if the product requirement is met.

In task 1490, a corrective action can be applied if the product requirement is not met.

An iPVD plasma process can be used for a barrier and a seed layer metallization in an advanced processing system since an iPVD plasma process can provide good sidewall and bottom coverage in the via and trench structures. The uniformity of the barrier and a seed layer metallization is dependant on the etch rate uniformity and/or deposition uniformity of the iPVD plasma process, and at increased background pressures both uniformities are more sensitive to the bias power applied at the substrate.

In one embodiment, the ionized physical vapor deposition apparatus 10 can include a segmented biased device. A segmented biased device can be used to provide improved control of the non-uniformity due to the redeposition effect. Segmented biased devices are taught in co-pending U.S. patent application Ser. No. 11/196,557 which is hereby incorporated by reference herein in its entirety. Alternatively, other biasing arrangements may be used.

Some of the principles of the redeposition due to the back-scattering and diffusion at the higher pressures of the background gas are described in co-pending patent application Ser. No. 11/536,758 (entitled "SELECTIVE-REDEPOSITION SOURCES FOR CALIBRATING A PLASMA PROCESS"), which is incorporated by reference above.

In one embodiment, the calibration wafer can include a carrier substrate covered by a layer of material for which the etch rate with and/or without a redeposition component, (i.e. actual and intrinsic etch rate, respectively) can be determined. In this case, a masking layer may not be required, and a patterned region comprising one or more selective-redeposition structures can be created in the layer of material. For example, the thickness inside the selective-redeposition structures can be greater than the thickness removed by an expected etch rate $R_{etch}$ (nm/sec) within etching time $t_{etch}$ (sec), that is $d_{film}(\text{structure}) > (R_{etch})(t_{etch})$, to avoid the punch-through outcome at the bottom of the structure. The aspect ratio (AR) can be greater than 6, and the diameter of the selective-redeposition structures can be less than 100 nm. The film thickness (distance from the flat field surface to the interface between the film and substrate) should be then at least $$d(\text{flat\_field}) \geq (AR)(D) + R_{etch} t_{etch}$$

where AR is the aspect ratio and D is the diameter for the selective-redeposition structure where $R_{etch}$ is in nm/sec and d(flat_field) film is in nm.

With renewed reference to FIGS. 2-4, during a plasma process etching can be performed by the ions in the plasma, and both the flat field region 53 and the bottom or base 57 of the structures 56 are exposed to the same etching rate because of the ion directionality. Removed material from the surface of the flat field region 53 can be thermalized after several collisions and the thermalization length can be dependent on the pressure of the background gas. The removed material can be backscattered and diffuse back to the surface of the flat field region 53, and it becomes redeposited material. Redepositing material, which has isotropic (random) angular distribution and has thermal energy (same energy as surrounding gas) can not penetrate deeply inside the structures 56. Less than several percent of the material originating from the surface of the flat field region 53 is redeposited inside the structures 56. Moreover, the random distribution of the redepositing neutral atoms can generate an overhang on the orifice of the selective-redeposition structures 56. When an overhang occurs, the amount of a material penetrating inside the selective-redeposition structures 56 and deposited at the bottom 57 may beeven more reduced.

If the initial thicknesses of the film in the flat field portion $d_{film}$(flat_field,0) and inside the selective-redeposition structure $d_{film}$(structure,0), and the post-exposure (etch) thicknesses in the flat field portion $d_{film}$(flat_field, $t_{etch}$) and inside the selective-redeposition structure $d_{film}$(structure, $t_{etch}$), an actual etching rate, an apparent (intrinsic) etching and the redeposition rate can be determined.

The initial depth of the selective-redeposition structure can be expressed as $$d(0) = (d_{film}(\text{flat\_field},0) - d_{film}(\text{structure},0))$$

and after exposing the calibration wafer to a plasma for a time period ($t_{etch}$) final depth of the selective-redeposition structure can be expressed as $$d(t_{etch}) = (d_{film}(\text{flat\_field}, t_{etch}) - d_{film}(\text{structure}, t_{etch}))$$

or using the etch and redeposition rates $$d(t_{etch}) = d(0) - [(R_{actual} - R_{redeposition})(t_{etch})] + R_{apparent} t_{etch} = d(0) + R_{deposition} t_{etch}$$

and $$R_{redeposition} = [d(t_{etch}) - d(0)]/(t_{etch})$$

The actual etch rate can be expressed as $$R_{actual} = [d(\text{structure}, t_{etch}) - d(\text{structure},0)]/(t_{etch})$$

and the apparent etch rate can be expressed as $$R_{apparent} = [d_{film}(\text{flat\_field}, t_{etch}) - d_{film}(\text{flat\_field},0)]/(t_{etch})$$

or $$R_{apparent} = (R_{atual} - R_{redeposition})$$

Material layer thicknesses can be measured using XRF and/or SEM metrology tools and/or determined using fabrication data. Alternatively, periodic patterns of structures may be used, and optical metrology tools may be used.

When the selective-redeposition structure is created, the amount of redeposition within the selective-redeposition structure is minimized (substantially eliminated), then $R_{redeposion} \rightarrow 0$ and $R_{apparent} \rightarrow R_{actual}$ and $$R_{actual} = \frac{d_{film}(\text{structure}, t_{etch}) - d_{film}(\text{structure}, 0)}{t_{etch}}$$

$$\cong \frac{d_{film}(\text{flat\_field}, t_{etch}) - d_{film}(\text{flat\_field}, 0)}{t_{etch}}$$

$$= R_{apparent}$$

In various embodiments, the calibration wafer can include a plurality of patterned regions, and each patterned region can contain one or more selective-redeposition structures. For example, a selective-redeposition structure can be a cylindrical structure having a diameter less than approximately 100 nm and an aspect ratio greater than six. Aspect ratios greater than ten can restrict the total ion flux towards the bottom of the selective-redeposition structure, and these aspect ratios may limit the ion based etch rate. In addition, aspect ratios less than six can allow a larger amount of neutral material to be collected in the selective-redeposition structure, and this can cause the determination of the actual etch to be less accurate.

In one embodiment, a patterned region of selective-redeposition structures can be created using a first selective-redeposition structure in a center position, and a number (N) of annular rings of selective-redeposition structures around the center position, where each annular ring comprises a second number (M) of selective-redeposition structures. For example, N can be equal to or greater than three, and M can be equal to or greater than four.

In other embodiments, the plurality of patterned regions of selective-redeposition structures can be created on the calibration wafer by creating a first number ($N_1$) of selective-redeposition structures in a circular pattern in the center portion of the calibration wafer, and then creating a second number ($N_2$) of annular rings of selective-redeposition structures around the center portion, where each annular ring comprises a third number ($N_3$) of selective-redeposition structures. Alternatively, a first number ($N_1$) of selective-redeposition structures can be created in a square pattern in a center portion of the calibration wafer, and a second number ($N_2$) of square rings of selective-redeposition structures can be created around the center position, where each square ring comprises a third number ($N_3$) of square patterns of selective-redeposition structures. For example, $N_1$ can be equal to or greater than three, $N_2$ can equal to or greater than one, and $N_3$ can be equal to or greater than five.

In other cases, a first number ($N_1$) of selective-redeposition structures can be created that have different dimensions and have different aspect ratios. The redeposition rate in each of the first number ($N_1$) of selective-redeposition structures can be determined, and the determined redeposition rate in each of the first number ($N_1$) of selective-redeposition structures can be compared to a product requirement. The determining of the redeposition rate process can be stopped if the product requirement is met, or a corrective action can be applied if the product requirement is not met. For example, the product requirement can be a simulation result based on an EM model.

In still other embodiments, a periodic pattern having a periodic arrangement of selective-redeposition structures can be created, and a redeposition rate can be determined for the periodic pattern. An optical metrology tool and/or library can be used to determine the initial and final thicknesses of the material inside and/or outside the structures in the periodic pattern. For example, measured signals can be compared to signals in a profile library to determine the thicknesses. The determined redeposition rate in the periodic pattern can be compared to a product requirement; and either the determining of the redeposition rate process can be stopped if the product requirement is met, or a corrective action can be applied if the product requirement is not met. For example, the periodic pattern can be created and/or measured using wavelengths in a range from approximately 100 nm to approximately 1000 nm.

In additional embodiments, the redeposition rate, or the actual etch rate, or the apparent etch rate, or a combination thereof calculated for the at least one of the plurality of selective-redeposition structures can be compared to a data collection requirement; and either the calculated redeposition rate, or the calculated actual etch rate, or the calculated apparent etch rate, or a combination thereof for the at least one of the plurality of selective-redeposition structures can be stored if the data collection is met, or a corrective action can be applied if the data collection requirement is not met. A data collection requirement can be determined by a data collection plan using context-based rules. In other cases, a calibration and/or modeling requirement may be used.

When the patterns of selective-redeposition structures symmetrically are positioned about a center of the calibration wafer, a spatial dependence of the redeposition rate relative to the center of the calibration wafer, or a spatial dependence of the actual etch rate relative to the center of the calibration wafer, or a spatial dependence of the apparent etch rate relative to the center of the calibration wafer, or a combination thereof can be determined; the spatial dependence of the redeposition rate relative to the center of the calibration wafer, or the spatial dependence of the actual etch rate relative to the center of the calibration wafer, or the spatial dependence of the apparent etch rate relative to the center of the calibration wafer, or a combination thereof can be compared to a product requirement; and either the determining of the redeposition rate process can be stopped if the product requirement is met, or a corrective action can be applied if the product requirement is not met. For example, the product requirement can be a uniformity value for the calibration wafer or the process being monitored by the calibration wafer.

The uniformity of the re-deposition may be determined by comparing the actual and apparent etching rates of selective-redeposition structures 56 near the center of the calibration wafer 50 with those rates of the selective-redeposition structures 56 near the edge of the calibration wafer 50.

Figure 15:
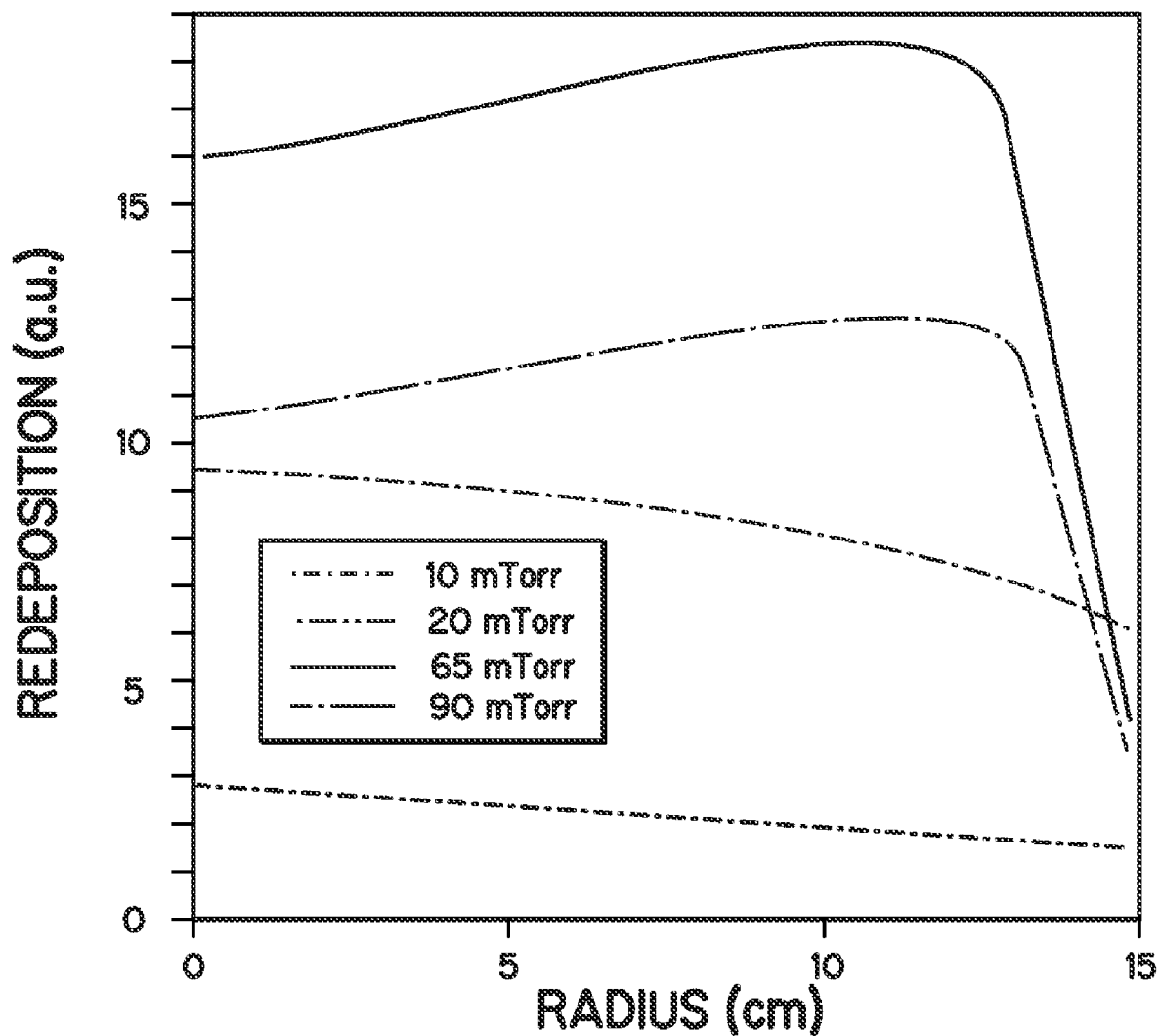
FIG. 15 illustrates a graph of redeposition amounts in accordance with embodiments of the invention.

FIG. 15 illustrates an exemplary graph of calculated redeposition amounts in accordance with the embodiments of the invention. The y-axis for the graph shows the redeposition amount (a.u.) number of selective-redeposition sources and the x-axis shows ($r_{mask}$) measured in centimeters where $r_{mask}$ can be the radius of the selective redeposition source. Data is shown for four different pressures 10 mTorr, 20 mTorr, 65 mTorr, and 90 mTorr.

Curves 500, 510 represent the calculated coverage at the bottom and sidewall of the selective redeposition sources due to the ion flux. Curves 520, 530 represent the coverage at the bottom and sidewall of the selective redeposition sources due to the neutral flux. The data indicates that for an aspect ratio (AR) approximately ranging from approximately 6 to approximately 10, the neutral flux at the bottom of the structure is less than 0.5%. This indicates there is a very low probability that the redeposited material returns towards the top surface in the ionized state. As a result, the redeposited material does not contribute to the redeposition at the bottom of the structure, which means due to the geometrical restriction (a submicron high aspect ratio structure) redeposition occurs at the flat field surface and selective redeposition occurs at the bottom of the selective-redeposition structure.

Figure 16:
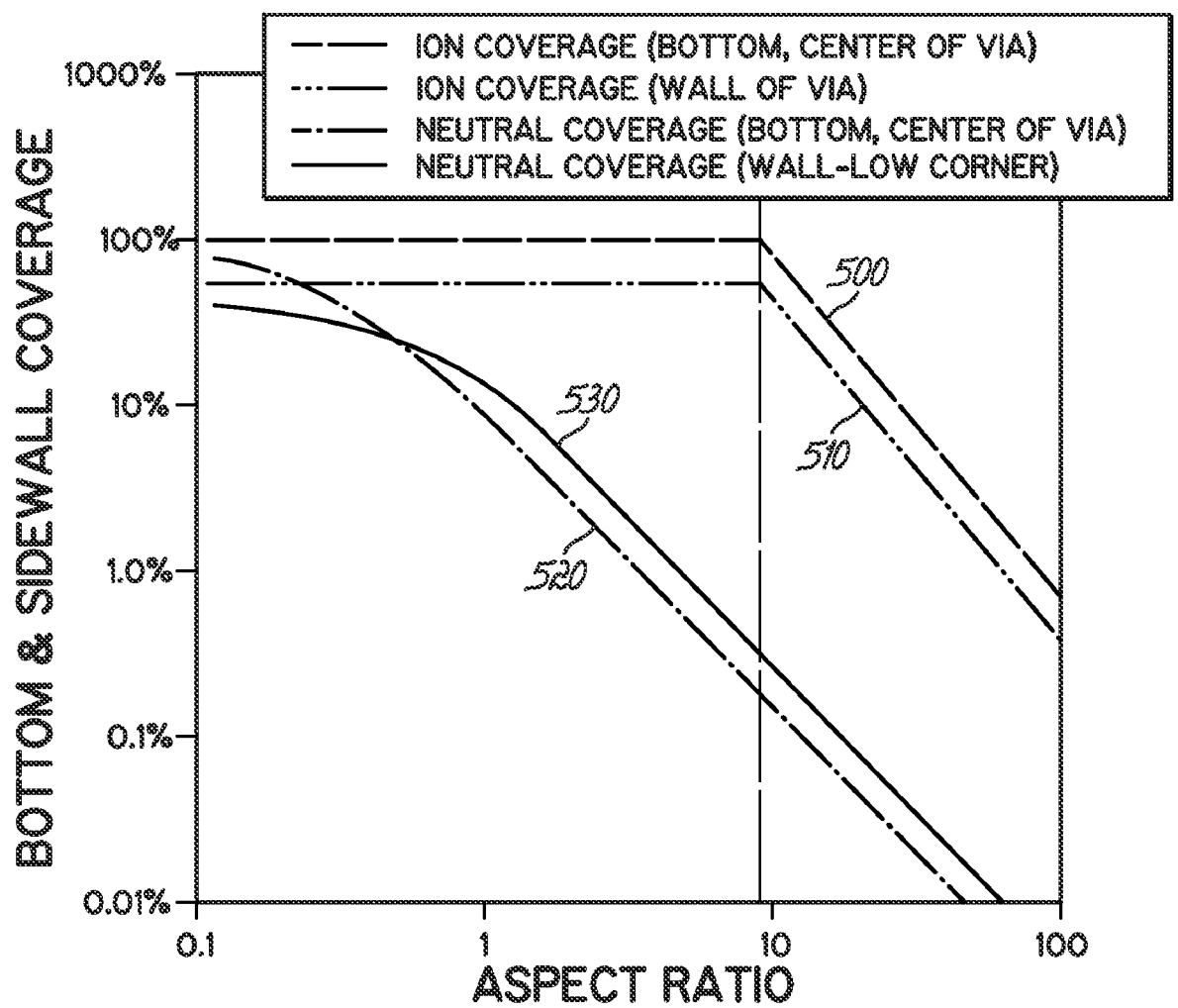
FIG. 16 illustrates a graph of the calculated bottom and sidewall coverage versus the feature aspect ration in accordance with embodiments of the invention.

FIG. 16 illustrates an exemplary graph of the calculated bottom and sidewall coverage versus the feature aspect ration in accordance with embodiments of the invention. Data is shown for ion and neutral coverage.

Figure 17:
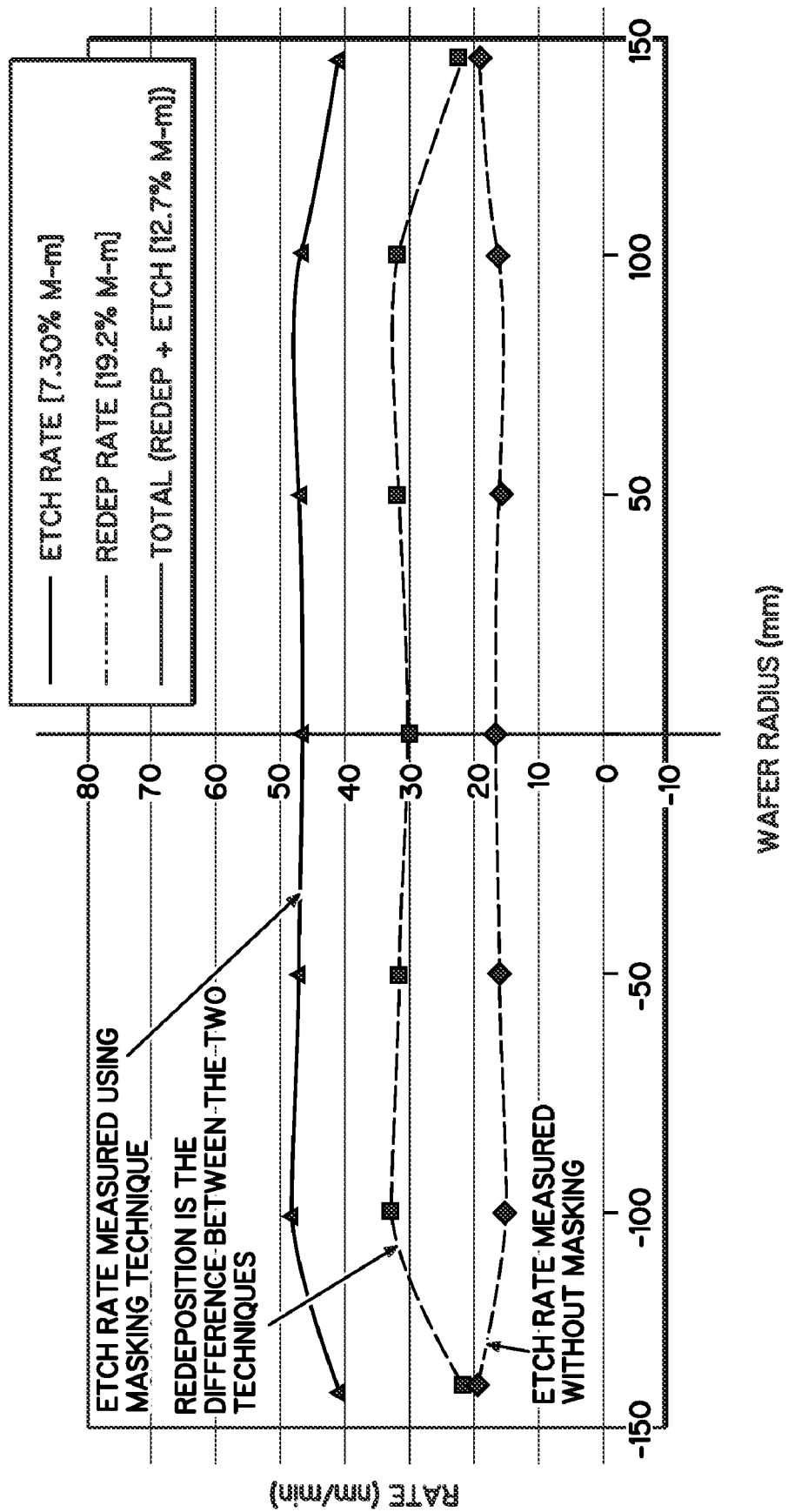
FIG. 17 illustrates a graph of etching performance in accordance with embodiments of the invention.

FIG. 17 illustrates an exemplary graph of etching performance in accordance with embodiments of the invention. The y-axis for the graph shows the rate in nanometers/minute and the x-axis shows the wafer radius measured in millimeters. Data is shown for an etch rate measured using masking techniques, an etch rate measured without masking, and redeposition rate. The first pressure is 65 mTorr and the material being used is copper.

The non-uniformity due to the redeposition at the higher pressures (>40 mTorr) is intrinsic to a sputter-etch process in an inert gas background and at the large diameter wafer. At the increased pressures above >70 mTorr the impact of the redeposition on the etch non-uniformity is reduced but still it has a significant impact on an absolute value of the etching rate. The measured "apparent" etching rate hides the value of an actual (intrinsic) etching rate due to a balancing factor from a redeposition rate. However, the quick evaluation of the absolute rate is also of a great significance in a process development and high aspect feature coverage. Therefore, the invention provides a calibration wafer and method to enable the etch rate uniformity assessment by excluding or minimizing the redeposition effect within a selective-redeposition structure during plasma processing. In addition, the calibration wafer can be used in the process development and/or modeling development.

While the invention is described in terms of use of the inventive calibration wafers with an ionized physical vapor deposition apparatus 10 (FIG. 13), a person having ordinary skill in the art will comprehend and appreciate that embodiments of the invention are applicable for determining an actual etch rate and redeposition rate in other types of plasma processing tools, such as etching and/or deposition tools.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of determining a redeposition rate for a plasma process using a previously calibrated wafer including a plurality of patterned regions of selective-redeposition structures in a layer of a material on a carrier substrate, the method comprising:

receiving the previously calibrated wafer on a wafer support within a vacuum chamber in an ionized plasma vapor deposition (IPVD) system;

determining an initial thickness of the material at a bottom portion of at least one of the selective-redeposition structures on the previously calibrated wafer and an initial thickness of the material in a flat field region between adjacent patterned regions of the selective-redeposition structures on the previously calibrated wafer;

exposing the previously calibrated wafer to the plasma process for an exposure time so as to etch the material from the bottom portion of the selective-redeposition structures on the previously calibrated wafer and from the flat field region between adjacent patterned regions of the selective-redeposition structures on the previously calibrated wafer;

determining a final thickness of the material at the bottom portion of the at least one of the selective-redeposition structures on the previously calibrated wafer and a final thickness of the material in the flat field region between adjacent patterned regions of the selective-redeposition structures on the previously calibrated wafer;

determining an actual etch rate ($R_{actual}$) of the material in the at least one of the selective-redeposition structures on the previously calibrated wafer from the initial and final thicknesses of the material at the bottom portion of the at least one of the selective-redeposition structures on the previously calibrated wafer and the exposure time;

determining an apparent etch rate ($R_{apparent}$) of the material from the initial and final thicknesses of the material in the flat field region between adjacent patterned regions of the selective-redeposition structures on the previously calibrated wafer and the exposure time; and determining the redeposition rate from a difference between the actual etch rate ($R_{actual}$) and the apparent etch rate ($R_{apparent}$).

2. The method of claim 1, further comprising:

comparing the redeposition rate, the actual etch rate, or the apparent etch rate, or a combination thereof to a product requirement; and either stopping the determining of the redeposition rate process if the product requirement is met or applying a corrective action if the product requirement is not met.

3. The method of claim 1, wherein the previously calibrated wafer is formed by a method that comprises:

depositing a continuous layer of the material on the carrier substrate;

applying a resist layer on the continuous layer;

exposing the resist layer to a pattern of radiation to impart a latent pattern characteristic of the plurality of patterned regions of selective-redeposition structures;

developing the latent pattern in the exposed resist layer;

creating the plurality of patterned regions of selective-redeposition structures for the previously calibrated wafer by transferring the developed pattern from the resist layer to the continuous layer, wherein the patterned resist layer is used as an etch mask for a directional anisotropic dry etching process; and removing the resist layer.

4. The method of claim 3, wherein creating the plurality of patterned regions of selective-redeposition structures for the previously calibrated wafer further comprises:

determining a thermalization length for the plasma process; and establishing a distance between the selective-redeposition structures on the previously calibrated wafer, the distance being equal to or greater than the thermalization length.

5. The method of claim 3, wherein creating the plurality of patterned regions of selective-redeposition structures for the previously calibrated wafer further comprises:

determining an area of the previously calibrated wafer; and establishing a total area of the selective-redeposition structures on the previously calibrated wafer, the total area being less than approximately 5 percent of the area of the previously calibrated wafer.

6. The method of claim 3, wherein creating the plurality of patterned regions of selective-redeposition structures for the previously calibrated wafer further comprises:

determining a profile for each selective-redeposition structure, the profile being determined using an area, a diameter, a depth, a width, a thickness, a sidewall angle, or an aspect ratio, or a combination thereof; and fabricating the selective-redeposition structures on the continuous layer using the profile.

7. The method of claim 6, further comprising:

defining the profile using an aspect ratio between 6:1 and 10:1 and a width of less than about 100 nanometers.

8. The method of claim 6, further comprising:

during the plasma process, determining an angular distribution for at least one of an ionized or a neutral species for use in determining the profile for each selective-redeposition structure.

9. The method of claim 6, further comprising:

during the plasma process, determining an angular distribution for at least one of an ionized or a neutral species for use in determining the sidewall angle in the profile for each selective-redeposition structure.

10. The method of claim 6, further comprising:

determining an etching rate, an etching time, or an endpoint, or a combination thereof for the directional anisotropic dry etching process; and determining the profile for the selective-redeposition structures using the etching rate, the etching time, or the endpoint, or the combination thereof for the directional anisotropic dry etching process.

11. The method of claim 3, wherein creating the plurality of patterned regions of selective-redeposition structures for the previously calibrated wafer further comprises:

determining at least two different profiles for the selective-redeposition structures, the at least two different profiles being determined using an area, a diameter, a depth, a width, a thickness, a sidewall angle, or an aspect ratio, or a combination thereof; and creating the selective-redeposition structures using the at least two different profiles.

12. The method of claim 1, further comprising:

determining an etching rate, an etching time, or an endpoint, or a combination thereof for the plasma process; and determining a profile for the selective-redeposition structures on the previously calibrated wafer using the etching rate, the etching time, or the endpoint, or the combination thereof for the plasma process.

13. The method of claim 1, further comprising:

determining an etching rate, an etching time, or an endpoint, or a combination thereof for the layer of material on the carrier substrate; and determining a profile for the selective-redeposition structures on the previously calibrated wafer using the etching rate, the etching time, or the endpoint, or the combination thereof for the layer of material on the carrier substrate.

14. The method of claim 1, further comprising:

determining a redeposition rate in each of a first number ($N_1$) of selective-redeposition structures on the previously calibrated wafer, wherein the first number ($N_1$) of selective-redeposition structures on the previously calibrated wafer have different aspect ratios, where $N_1$ is a integer equal to or greater than one;

comparing the determined redeposition rate in each of the first number ($N_1$) of selective-redeposition structures on the previously calibrated wafer to a product requirement; and stopping the determining of the redeposition rate process if the product requirement is met, or applying a corrective action if the product requirement is not met.

15. The method of claim 1, further comprising:

determining a redeposition rate in a periodic pattern, the periodic pattern having a periodic arrangement of selective-redeposition structures on the previously calibrated wafer;

comparing the determined redeposition rate in the periodic pattern to a product requirement; and stopping the determining of the redeposition rate process if the product requirement is met, or applying a corrective action if the product requirement is not met.

16. The method of claim 1, further comprising:

comparing the redeposition rate, or the actual etch rate, or the apparent etch rate, or a combination thereof calculated for the at least one of the plurality of selective-redeposition structures on the previously calibrated wafer to a product requirement; and either storing the redeposition rate, or the actual etch rate, or the apparent etch rate, or a combination thereof if the product requirement is met or applying a corrective action if the product requirement is not met.

17. The method of claim 1, further comprising:

determining a spatial dependence of the redeposition rate relative to a center of the previously calibrated wafer, a spatial dependence of the actual etch rate relative to the center of the previously calibrated wafer, or a spatial dependence of the apparent etch rate relative to the center of the previously calibrated wafer, or a combination thereof;

comparing the spatial dependence of the redeposition rate relative to the center of the previously calibrated wafer, the spatial dependence of the actual etch rate relative to the center of the previously calibrated wafer, or the spatial dependence of the apparent etch rate relative to the center of the previously calibrated wafer, or a combination thereof to a product requirement; and either stopping the determining of the redeposition rate process if the product requirement is met or applying a corrective action if the product requirement is not met.

18. The method of claim 17, wherein the IPVD process comprises an etching process, or a deposition process, or a combination thereof.

19. The method of claim 1, wherein performing the plasma process further comprises:

placing the previously calibrated wafer onto a chuck of the wafer support disposed inside the vacuum chamber; and performing an IPVD process.

\* \* \* \* \*

UNITED STATES PATENT AND TRADEMARK OFFICE
CERTIFICATE OF CORRECTION

PATENT NO. : 7,776,748 B2  Page 1 of 1
APPLICATION NO. : 11/536902
DATED : August 17, 2010
INVENTOR(S) : Jozef Brcka It is certified that error appears in the above-identified patent and that said Letters Patent is hereby corrected as shown below:

In column 3, line 45, change "ration" to --ratio--.

In column 5, line 16, before "can", insert --that--.

In column 6, line 60, change "system s" to --systems--.

In column 8:
Line 27, after "use", insert --of--.
Line 28, after "use", insert --of--.

In column 9, line 4, change "dfilm" to --dfeature--.

In column 10, line 6, change "or" to --of-- and in line 39, change "serve" to --serves--.

In column 11, line 51, after "exposed" insert --patterned regions--.

In column 13, line 24, after "such", insert --as--.

In column 16, line 25, change "dependant" to --dependent--.

In column 17:
Line 21, change "beeven" to --be even--.
Line 58, change "atual" to --actual--.
Line 67, change "redeposion" to --redeposition--.

In column 18, line 46, before "equal" insert --be--.

In column 19, line 60, before "ranging", delete --approximately--.

In column 20, line 4, change "ration" to --ratio--.

Signed and Sealed this

Twenty-third Day of November, 2010

David J. Kappos
*Director of the United States Patent and Trademark Office*